US011129267B2

(12) United States Patent
Watanabe et al.

(10) Patent No.: US 11,129,267 B2
(45) Date of Patent: Sep. 21, 2021

(54) ACTIVE GAS GENERATION APPARATUS

(71) Applicant: Toshiba Mitsubishi-Electric Industrial Systems Corporation, Chuo-ku (JP)

(72) Inventors: Kensuke Watanabe, Tokyo (JP); Ren Arita, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 21 days.

(21) Appl. No.: 16/619,269

(22) PCT Filed: Feb. 13, 2019

(86) PCT No.: PCT/JP2019/005025
§ 371 (c)(1),
(2) Date: Dec. 4, 2019

(87) PCT Pub. No.: WO2020/165964
PCT Pub. Date: Aug. 20, 2020

(65) Prior Publication Data
US 2020/0260565 A1  Aug. 13, 2020

(51) Int. Cl.
*H05H 1/24* (2006.01)
*H01J 37/32* (2006.01)

(52) U.S. Cl.
CPC ..... *H05H 1/2406* (2013.01); *H01J 37/32348* (2013.01); *H01J 37/32568* (2013.01); *H05H 1/2443* (2021.05)

(58) Field of Classification Search
CPC ......... H05H 1/2406; H05H 2001/2443; H05H 2001/2437; H05H 2245/1215;
(Continued)

(56) References Cited

U.S. PATENT DOCUMENTS

| 6,354,903 B1* | 3/2002 | Nelson | B01D 53/92 |
| | | | 445/58 |
| 2006/0133970 A1* | 6/2006 | Imanishi | B01D 53/92 |
| | | | 422/186 |

(Continued)

FOREIGN PATENT DOCUMENTS

| JP | 2537304 B2 | 9/1996 |
| JP | 5328685 B2 | 10/2013 |

OTHER PUBLICATIONS

International Search Report dated Apr. 16, 2019 in PCT/JP2019/005025 filed on Feb. 13, 2019.

*Primary Examiner* — Xiuyu Tai
(74) *Attorney, Agent, or Firm* — Xsensus LLP

(57) ABSTRACT

A gas passing groove, a high-voltage electrode groove, and a ground electrode groove provided to an electrode unit base are each helical in plan view. An electrode unit lid is placed on a front surface of the electrode unit base so that a high-voltage conduction hole and a high-voltage conduction point coincide with each other in plan view. An electrode cooling plate is placed on a front surface of the electrode unit lid so that a high-voltage opening includes the high-voltage conduction hole as a whole in plan view. The electrode unit lid and the electrode cooling plate are placed on the front surface of the electrode unit base so that a ground conduction groove, a ground conduction hole, and a ground conduction point coincide with one another in plan view.

5 Claims, 16 Drawing Sheets

(58) Field of Classification Search
CPC ........ H05H 2001/2418; H01J 37/32348; H01J 37/32568; H01J 37/3244; H01J 37/32449; H01J 37/32357; H01J 37/32541; H01J 37/32009; H01J 37/32724; C23C 16/45574; C23C 16/45572; C23C 16/45565; C23C 16/455; C23C 16/45563; C23C 16/507; C23C 16/505; B01D 53/92; B01D 2257/404; B01D 2259/818; F01N 3/2825; F01N 3/2828; F01N 2240/28; F01N 3/0892; Y10T 29/49204; Y10T 29/49345

See application file for complete search history.

(56) References Cited

U.S. PATENT DOCUMENTS

| | | | | |
|---|---|---|---|---|
| 2010/0193129 A1* | 8/2010 | Tabata | ............... | H01J 37/32009 156/345.35 |
| 2014/0182879 A1* | 7/2014 | Busse | ............... | H01J 37/32541 174/98 |
| 2015/0115798 A1* | 4/2015 | Szatkowski | ............... | H05H 1/46 315/111.21 |

* cited by examiner

F I G. 5
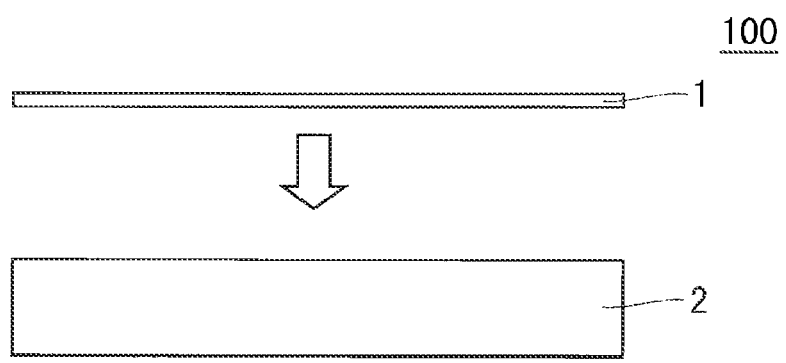

US 11,129,267 B2

ACTIVE GAS GENERATION APPARATUS

TECHNICAL FIELD

The present invention relates to active gas generation apparatuses having parallel plate electrode-type electrode structures for use in semiconductor deposition apparatuses and utilizing dielectric barrier discharges.

BACKGROUND ART

An active gas generation apparatus having a parallel plate electrode-type electrode structure and utilizing a dielectric barrier discharge is installed, for example, above a workpiece, such as a wafer. In this case, it is necessary to uniformly spray an active gas onto the workpiece as a whole, and thus a shower plate for uniform gas spraying is typically placed between the active gas generation apparatus and the workpiece.

An active gas passing region in the shower plate, however, is a non-discharge space uninvolved in the dielectric barrier discharge, and thus the active gas is deactivated in a time period during which the active gas passes through the active gas passing region in the shower plate. In a case where the active gas generation apparatus generates an extremely short-lived active gas, such as a nitrogen radical, deactivation of the radical is significantly accelerated during passing through the shower plate.

As described above, use of the shower plate for the active gas generation apparatus is not desirable as it promotes a phenomenon of deactivation of the active gas.

One example of a conventional active gas generation apparatus not using the shower plate is an atmospheric plasma reactor disclosed in Patent Document 1.

First conventional technology disclosed in Patent Document 1 uses an electrode structure in which plate-like electrodes are vertically arranged to oppose each other, and an active gas generated by a discharge between the electrodes is sprayed onto a substrate. In the first conventional technology, a plurality of electrode structures are arranged to deal with processing performed on a large-area substrate.

As described above, in the first conventional technology, a response according to the area of the substrate can easily be made by increasing the number of electrode structures to use a plurality of electrode structures.

Another example of the active gas generation apparatus not using the shower plate is a plasma processing apparatus disclosed in Patent Document 2.

In second conventional technology disclosed in Patent Document 2, one of plate-like electrodes horizontally arranged to oppose each other has a plurality of gas jets to eliminate the need for the shower plate and to enable processing performed on a large substrate.

A first basic configuration is disclosed in a paragraph [0022] and FIGS. 1 and 2 of Patent Document 2. A specific configuration is as described below. Numbers in parentheses are reference signs used in Patent Document 2.

The first basic configuration uses a structure in which a conductive layer (12) is formed on the surface of a high-voltage electrode (8) not having conductivity, and a grounded metal plate (2) is brought into contact with a ground electrode (7) located below the high-voltage electrode (8) and not having conductivity.

A second basic configuration is disclosed in a paragraph [0063] and FIG. 9 of Patent Document 2. A specific configuration is as described below. Numbers in parentheses are reference signs used in Patent Document 2.

The second basic configuration uses, in addition to the first basic configuration, a structure in which a ground conductive layer (41) is buried in the ground electrode (7).

PRIOR ART DOCUMENTS

Patent Documents

Patent Document 1: Japanese Patent No. 2537304
Patent Document 2: Japanese Patent No. 5328685

SUMMARY

Problem to be Solved by the Invention

In the first conventional technology disclosed in Patent Document 1, the plurality of electrode structures are used to enable an apparatus to deal with a workpiece having a relatively large area.

Use of the plurality of electrode structures in the first conventional technology, however, requires a high-voltage electrode and a ground electrode to be provided for each of the plurality of electrode structures, and thus complicates an apparatus structure. Furthermore, in the first conventional technology, it is required to sufficiently increase a vertical size of formation of the high-voltage electrode and the ground electrode constituting each of the electrode structures to increase the concentration of the active gas as a source gas vertically passes. This naturally increases the height of the apparatus, and leads to an increase in size of the apparatus.

As described above, the first conventional technology disclosed in Patent Document 1 has a problem in that the apparatus structure is complicated and the size of the apparatus is increased.

The second conventional technology disclosed in Patent Document 2 will be considered next. Numbers in parentheses are reference signs used in Patent Document 2.

In the above-mentioned first basic configuration, an electric field strength on the surface, such as the end of the conductive layer (12), extremely increases to cause electrical breakdown in a gas layer of a discharge portion (3), and thereby an abnormal discharge occurs in the conductive layer (12), which is metal, to generate particles and a metal vapor in the discharge portion (3). That is to say, substances vaporized from the conductive layer (12), a chamber (1), or the partition plate (2) with the abnormal discharge in the conductive layer (12) become sources of contamination.

As a surface layer of the conductive layer (12) leads to a discharge site (space (9)) between electrodes, molecules vaporized from the conductive layer (12) can be mixed into the active gas, and contaminate a substrate (15) in the process of transporting the gas to the discharge site.

As described above, the first basic configuration in the second conventional technology has a problem in that the particles and the metal vapor are generated in the discharge portion (3), and can contaminate the substrate (15).

To surely prevent the above-mentioned possibility of contamination of the substrate (15), it is necessary to leave a sufficient insulation distance in the discharge portion (3). An increase in insulation distance, however, naturally leads to an increase in size of an apparatus configuration, and is thus not desirable.

On the other hand, in the above-mentioned second basic configuration in Patent Document 2, the conductive layer (12) on the high-voltage electrode (8) is exposed to the surface of the electrode as in the first basic configuration. It is theoretically possible not to expose the conductive layer on each of a high-voltage side and a ground side by taking similar measures against the high-voltage electrode to those taken against the ground electrode.

FIG. 15 is a sectional view illustrating a sectional structure of the second basic configuration in the second conventional technology. In FIG. 15, a space 109 corresponds to the space (9), a first electrode 107 corresponds to the ground electrode (7), a pore 110 corresponds to a pore (10), a ground conductive layer 141 corresponds to the ground conductive layer (41), and a ground gap 142 corresponds to a ground gap (42).

As illustrate in FIG. 15, an opening region H141 of the ground conductive layer 141 includes the pore 110 and is formed to have a wider shape than the pore 110, and thus there is the ground gap 142 between an electrode unit 100 and the ground conductive layer 141. The ground conductive layer 141 is not formed in the ground gap 142.

A region above the ground gap 142 in the space 109 serving as the discharge site between electrodes is thus a non-discharge space, and the active gas is only deactivated when the gas passes through the non-discharge space to reduce the concentration of the active gas.

A modification in which the ground conductive layer 141 is improved to be free of the ground gap 142 (the pore 110 and an opening region of the opening region H141 of a main pole portion have the same size) will be considered next.

FIG. 16 is a sectional view illustrating a sectional structure of the modification of the second basic configuration in the second conventional technology. A region illustrated in FIG. 16 corresponds to a region illustrated by enlarging a focused region R7 and a region near the focused region R7 in FIG. 15.

In the modification of the second basic configuration, the ground conductive layer 141 is exposed to the pore 110 when the pore 110 is observed in cross section. Conductive layer components of the ground conductive layer 141 are thus externally discharged as contaminants when electrical breakdown occurs in the pore 110 near the exposed portion of the ground conductive layer 141.

As described above, the second basic configuration (FIG. 15) in the second conventional technology has the problem in that the concentration of the active gas is reduced, and the modification (FIG. 16) of the second basic configuration has the problem in that the contaminants are generated.

It is an object of the present invention to provide an active gas generation apparatus solving problems as described above, having a simplified and size-reduced apparatus configuration, and enabling suppression of a phenomenon of deactivation of an active gas.

Means to Solve the Problem

An active gas generation apparatus according to the present invention is an active gas generation apparatus generating an active gas by activating a source gas supplied to a discharge space in which a dielectric barrier discharge occurs, and including: an electrode unit base including a first electrode and a second electrode, and externally receiving an AC voltage; an electrode unit lid located on a front surface of the electrode unit base; an electrode pressing plate located on a front surface of the electrode unit lid, and pressing the electrode unit lid with a pressing force applied from above; and an apparatus housing containing the electrode unit base, the electrode unit lid, and the electrode pressing plate, wherein the electrode unit base includes: a first electrode groove and a second electrode groove each having a predetermined formation depth from the front surface; the first electrode and the second electrode embedded respectively in the first electrode groove and the second electrode groove, and each having conductivity; and an internal gas flow path located in the electrode unit base, and allowing the source gas to pass therethrough, the internal gas flow path being disposed to be helical in plan view, the first electrode and the second electrode each being disposed to be helical in plan view along with the internal gas flow path, the first electrode and the second electrode respectively have a first conduction point and a second conduction point at ends thereof, the first electrode and the second electrode are arranged on opposite sides of the internal gas flow path to oppose each other with a part of the electrode unit base and the internal gas flow path therebetween, a region in the internal gas flow path between the first electrode and the second electrode being the discharge space, the dielectric barrier discharge occurring in the discharge space upon reception of the AC voltage, the electrode unit base further includes at least one gas jet located below the discharge space to communicate with the internal gas flow path, the active gas acquired by activating the source gas supplied to the discharge space being jetted from the at least one gas jet, the electrode unit lid has a gas relay hole leading to the internal gas flow path in the electrode unit base, and a first through hole and a second through hole located respectively in a region coinciding with the first conduction point and a region coinciding with the second conduction point in plan view, and the electrode pressing plate has an opening including the first through hole in plan view and having a wider shape than the first through hole, and a gas supply hole located in a region coinciding with the gas relay hole in plan view, and is electrically connected to the second conduction point through the second through hole.

Effects of the Invention

The electrode unit base in the active gas generation apparatus as the invention of the present application in Claim 1 includes the internal gas flow path disposed to be helical in plan view and the at least one gas jet (jetting hole) located below the discharge space to communicate with the internal gas flow path.

The active gas generation apparatus as the invention of the present application in Claim 1 thus has an effect of effectively suppressing a phenomenon of deactivation of the active gas because a non-discharge space uninvolved in the dielectric barrier discharge is not formed between the at least one gas jet and the discharge space.

Furthermore, the above-mentioned effect can be produced by a relatively easy configuration in which the at least one gas jet, the first electrode, the second electrode, and the internal gas flow path are provided to the electrode unit base, and an apparatus configuration of the active gas generation apparatus can thereby be simplified.

In addition, in the active gas generation apparatus as the invention of the present application in claim 1, the internal gas flow path is disposed to be helical in plan view. The active gas can thus be jetted from the at least one gas jet with a gas concentration being saturated without increasing the area of the electrode unit base itself, so that the size of the apparatus can be reduced.

Furthermore, in the active gas generation apparatus as the invention of the present application in Claim 1, the electrode unit lid has a first conduction hole and a second conduction hole as through holes located respectively in the region coinciding with the first conduction point and the region coinciding with the second conduction point in plan view.

The electrode unit lid can thus block a top portion of the electrode unit base while securing a function to externally and electrically connect the first conduction point and the second conduction point respectively through the first conduction hole and the second conduction hole.

Furthermore, the electrode pressing plate has the opening including the first through hole in plan view and having a wider shape than the first through hole, and thus a function to externally and electrically connect the first conduction point through the first conduction hole can be secured. The electrode pressing plate can further be electrically connected to the second conduction point through the second conduction hole.

In addition, the electrode pressing plate can stably press the electrode unit lid.

The objects, features, aspects, and advantages of the present invention will become more apparent from the following detailed description and the accompanying drawings.

BRIEF DESCRIPTION OF DRAWINGS

FIG. 5 is an illustration showing a schematic configuration of an electrode unit for use in the active gas generation apparatus in the embodiment.

DESCRIPTION OF EMBODIMENT

Embodiment (Overall Configuration)

Figure 1:
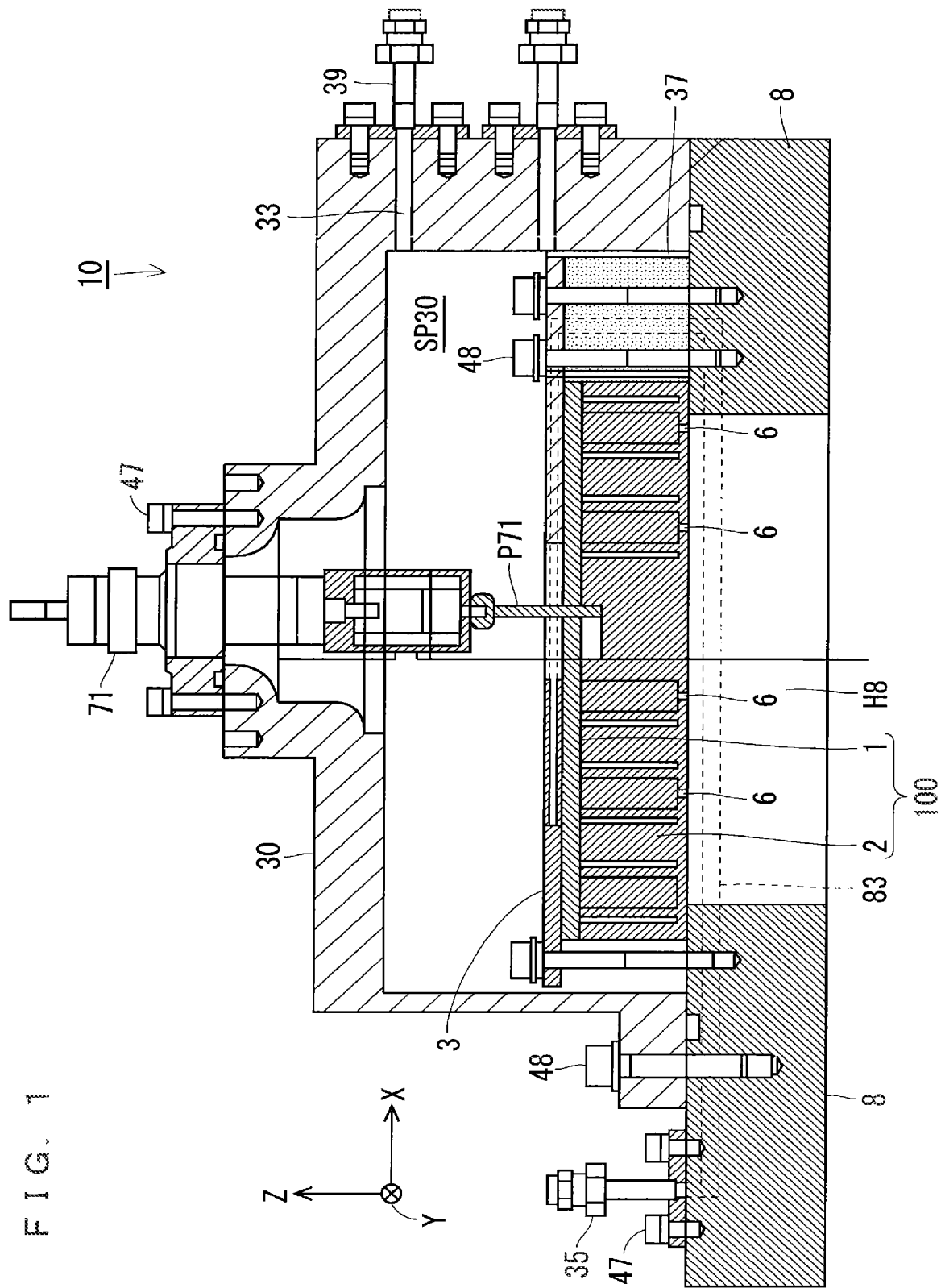
FIG. 1 is an illustration showing a sectional structure of an active gas generation apparatus in an embodiment of the present invention.

FIG. 1 is an illustration showing a sectional structure of an active gas generation apparatus 10 in an embodiment of the present invention. The active gas generation apparatus 10 in the present embodiment generates an active gas by activating a source gas supplied to a discharge space in which a dielectric barrier discharge occurs.

The active gas generation apparatus 10 includes, as main components, an apparatus housing 30, an electrode unit lid 1, an electrode unit base 2, an electrode cooling plate 3, a generator base flange 8, a coolant manifold 37, and a high-voltage terminal 71.

The electrode unit base 2 includes a high-voltage electrode 11 as a first electrode and a ground electrode 12 as a second electrode, and externally receives an AC voltage through the high-voltage terminal 71.

The electrode unit lid 1 is provided on a front surface of the electrode unit base 2. The electrode unit lid 1 and the electrode unit base 2 are each configured by a dielectric.

The electrode cooling plate 3 as an electrode pressing plate is provided on a front surface of the electrode unit lid 1, and has conductivity. The electrode cooling plate 3 can press the electrode unit lid 1 with a pressing force applied by an elastic member, such as a spring, which is not illustrated, provided above the electrode cooling plate 3.

The apparatus housing 30 contains the electrode unit base 2, the electrode unit lid 1, and the electrode cooling plate 3 in a containing space SP30.

The generator base flange 8 has an opening H8 in a central region to expose all of a plurality of gas jets (jetting holes) 6 provided in a rear surface of the electrode unit base 2.

Furthermore, a region on the rear surface of the electrode unit base 2 located external to the opening H8 is placed on a front surface of the generator base flange 8. The generator base flange 8 thus supports the electrode unit base 2 from a side of the rear surface.

The coolant manifold 37 is placed, on a part of the front surface of the generator base flange 8, adjacent to the electrode unit lid 1 and the electrode unit base 2. A front surface height of the coolant manifold 37 matches a front surface height of the electrode unit lid 1, and the electrode cooling plate 3 is placed not only on the front surface of the electrode unit lid 1 but also on a front surface of the coolant manifold 37.

A cooling medium circulation mechanism circulating a coolant as a cooling medium in the electrode cooling plate 3 is configured by the assembly of the generator base flange 8 and the coolant manifold 37 as described below. The electrode cooling plate 3 thus has a cooling function to cool the electrode unit base 2 from a side of the electrode unit lid 1.

On one side of the opening H8 (on the right side of FIG. 1), the electrode cooling plate 3, the coolant manifold 37, and the generator base flange 8 are joined together by attachment screws 48. On the other side of the opening H8 (on the left side of FIG. 1), the electrode cooling plate 3 and the generator base flange 8 are directly joined together by an attachment screw 48.

As described above, the electrode cooling plate 3, the electrode unit lid 1, the electrode unit base, and the cooling medium circulation mechanism (the coolant manifold 37+the generator base flange 8) are integrally joined together by the attachment screws 48. The apparatus housing 30 is directly joined to the generator base flange 8 by an attachment screw 48. The apparatus housing 30 is thus fixed onto the generator base flange 8.

Furthermore, the high-voltage terminal 71 as an AC voltage supply terminal supplying the AC voltage is attached to a top portion of the apparatus housing 30 by attachment screws 47, and is electrically connected to the high-voltage electrode 11 in the electrode unit base 2 as described below.

Gas supply flanges 39 are provided on one side surface of the apparatus housing 30, and a source gas is supplied from the gas supply flanges 39 into the containing space SP30 through source gas supply paths 33.

(Electrode Unit Base 2)

Figure 2:
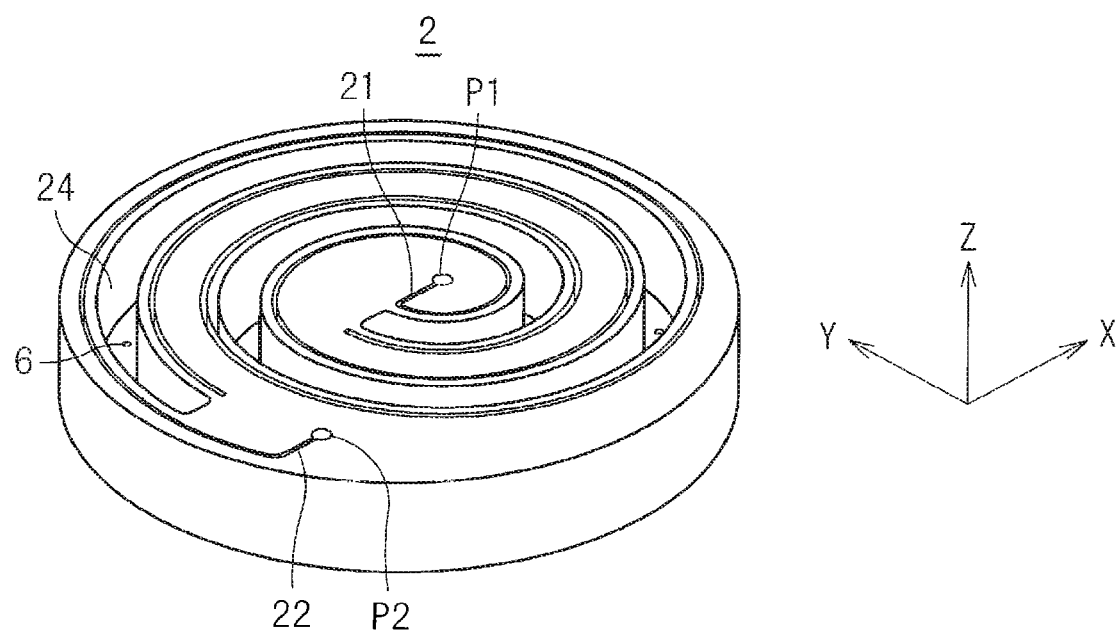
FIG. 2 is a perspective view illustrating the structure of an electrode unit base illustrated in FIG. 1.
Figure 3:
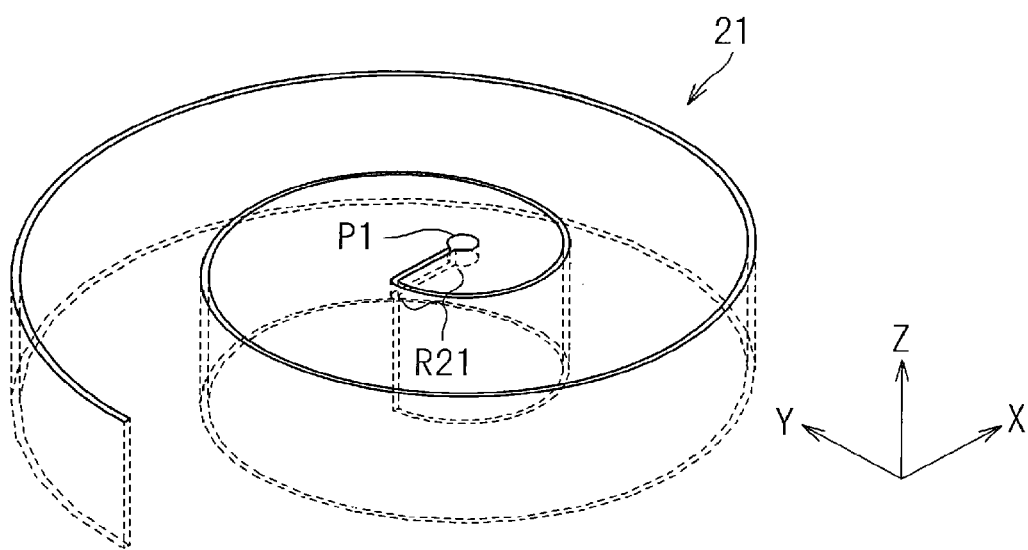
FIG. 3 is a perspective view focusing only n a high-voltage electrode groove illustrated in FIG. 2.
Figure 4:
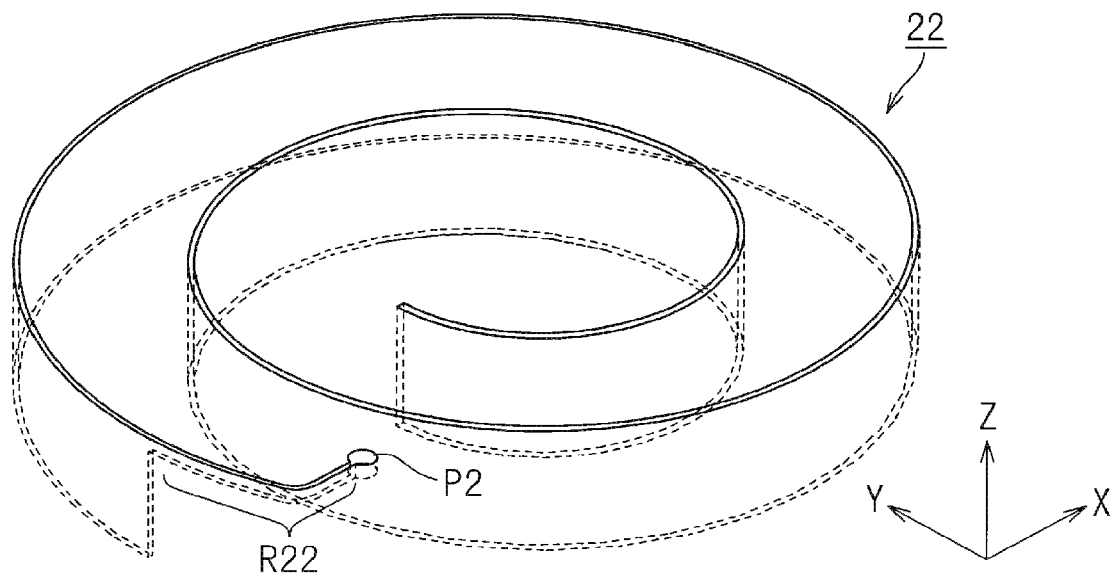
FIG. 4 is a perspective view focusing only on a ground electrode groove illustrated in FIG. 2.

FIG. 2 is a perspective view illustrating the structure of the electrode unit base 2 illustrated in FIG. 1. FIG. 3 is a perspective view focusing only on a high-voltage electrode groove 21 (a first electrode groove) illustrated in FIG. 2. FIG. 4 is a perspective view focusing only on a ground electrode groove 22 (a second electrode groove) illustrated in FIG. 2. An XYZ Cartesian coordinate system is shown in each of FIGS. 2 to 4.

FIG. 5 is an illustration showing a schematic configuration of an electrode unit 100 for use in the active gas generation apparatus 10 in Embodiment. An XYZ Cartesian coordinate system is shown in FIG. 5. The XYZ Cartesian coordinate system is shown in each of FIGS. 6 to 8 described below as in FIG. 5.

As illustrated in FIG. 5, the electrode unit 100 includes, as main components, the electrode unit lid 1 and the electrode unit base 2, which are each configured by the dielectric. The electrode unit lid 1 is provided on the front surface of the electrode unit base 2.

Figure 6:
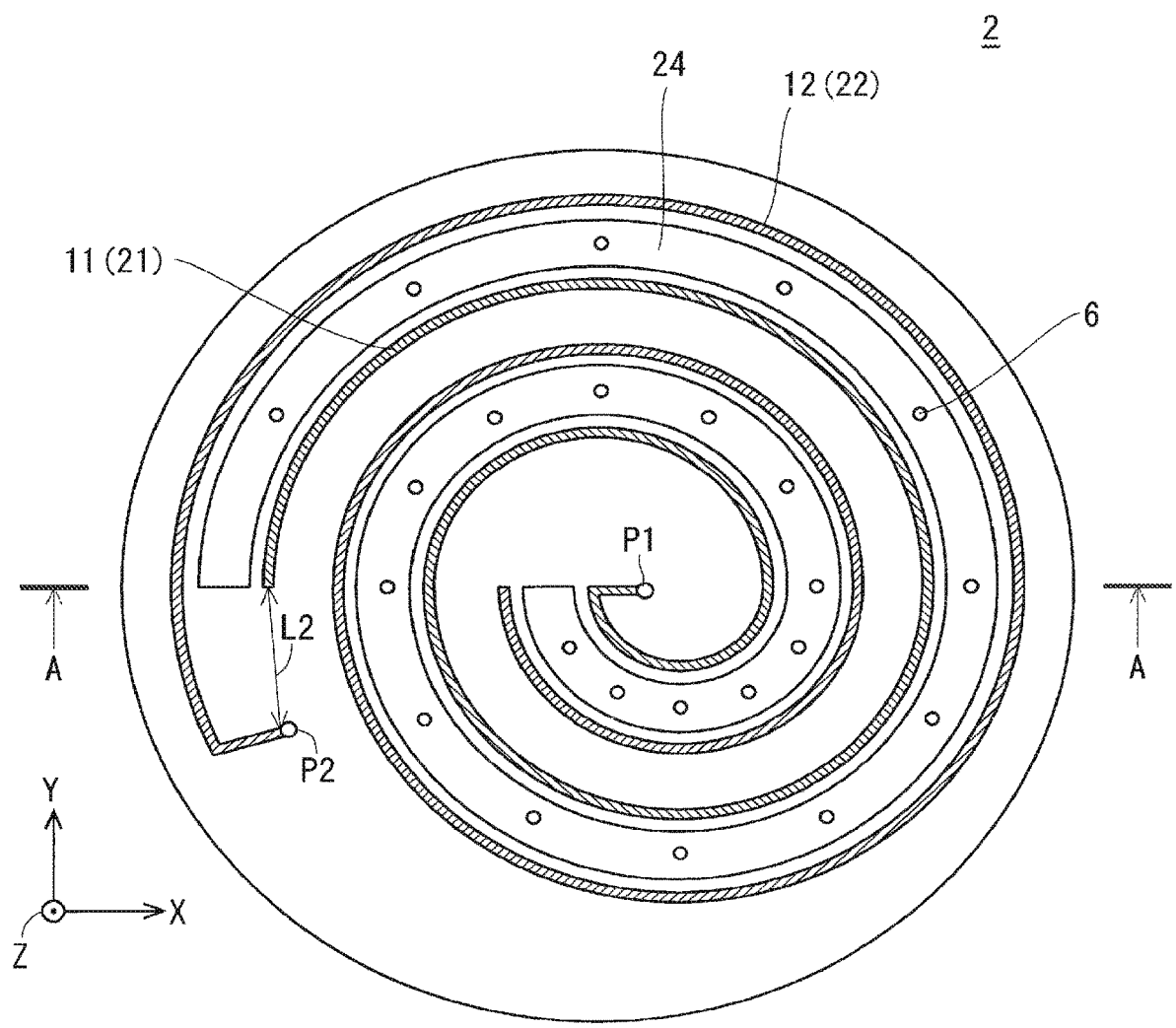
FIG. 6 is a top plan view illustrating a planar structure of the electrode unit base.

FIG. 6 is a top plan view illustrating a planar structure of the electrode unit base 2. As illustrated in FIGS. 2 and 6, the electrode unit base 2 is circular in plan view.

As illustrated in FIGS. 2 to 4 and 6, a gas passing groove 24, a high-voltage electrode groove 21, and a ground electrode groove 22 are formed in the electrode unit base 2 from the front surface of the electrode unit base 2. The gas passing groove 24, the high-voltage electrode groove 21, and the ground electrode groove 22 are each formed to be helical in plan view.

Figure 7:
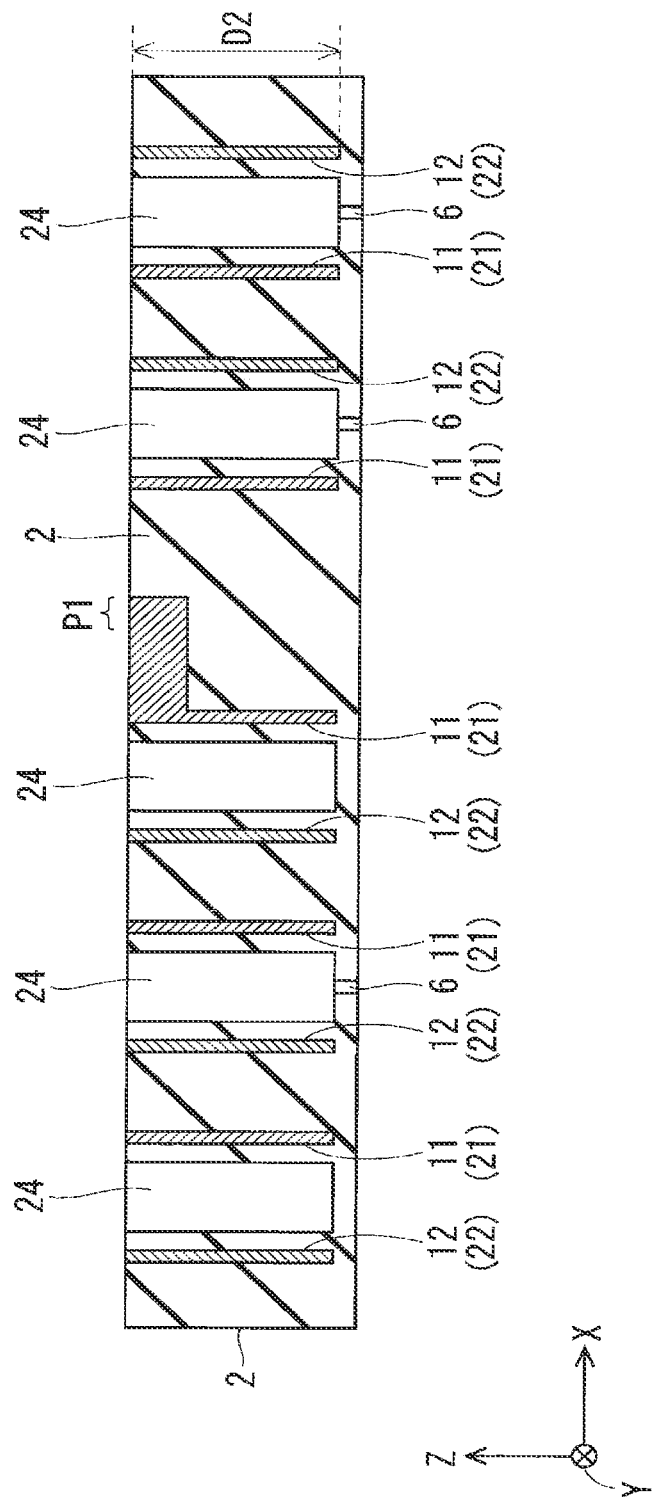
FIG. 7 is a sectional view illustrating a sectional structure of the electrode unit base.

FIG. 7 is a sectional view illustrating a sectional structure of the electrode unit base 2. FIG. 7 is taken along the line A-A of FIG. 6.

As illustrated in FIG. 7, the gas passing groove 24, the high-voltage electrode groove 21, and the ground electrode groove 22 are each formed to have the bottom located slightly higher than the bottom of the electrode unit base 2. Formation depths of the gas passing groove 24, the high-voltage electrode groove 21, and the ground electrode groove 22 from the front surface are set to the same depth D2.

As described above, the electrode unit base 2 has the high-voltage electrode groove 21 as the first electrode groove and the ground electrode groove 22 as the second electrode groove provided to have the same formation depth from the front surface.

The electrode unit base 2 further has the gas passing groove 24 as an internal gas flow path formed as a groove to have the depth D2 (a predetermined formation depth) from the front surface.

The high-voltage electrode groove 21 and the ground electrode groove 22 are arranged on sides of opposite side surfaces of the gas passing groove 24 in the electrode unit base 2 to oppose each other with a part of the electrode unit base 2 and the gas passing groove 24 therebetween and to be helical in plan view along with the gas passing groove 24.

The high-voltage electrode 11 as the first electrode is embedded in the high-voltage electrode groove 21 as the first electrode groove, and the ground electrode 12 as the second electrode is embedded in the ground electrode groove 22 as the second electrode groove. In this case, the high-voltage electrode 11 is embedded throughout the high-voltage electrode groove 21 so as not to form a gap in the high-voltage electrode groove 21, and the ground electrode 12 is embedded throughout the ground electrode groove 22 so as not to form a gap in the ground electrode groove 22.

As illustrated in FIGS. 2 and 6, in the active gas generation apparatus 10 in the present embodiment, the high-voltage electrode 11 and the ground electrode 12 are arranged in the electrode unit 100 so that the ground electrode 12 is located on an outermost periphery of the electrode unit base 2 in plan view.

The high-voltage electrode 11 and the ground electrode 12 are thus arranged on the sides of the opposite side surfaces of the gas passing groove 24 in the electrode unit base 2 to oppose each other with the part of the electrode unit base 2 and the gas passing groove 24 therebetween and to be helical in plan view along with the gas passing groove 24. A region in the gas passing groove 24 between the high-voltage electrode 11 and the ground electrode 12 is a discharge space.

Figure 8:
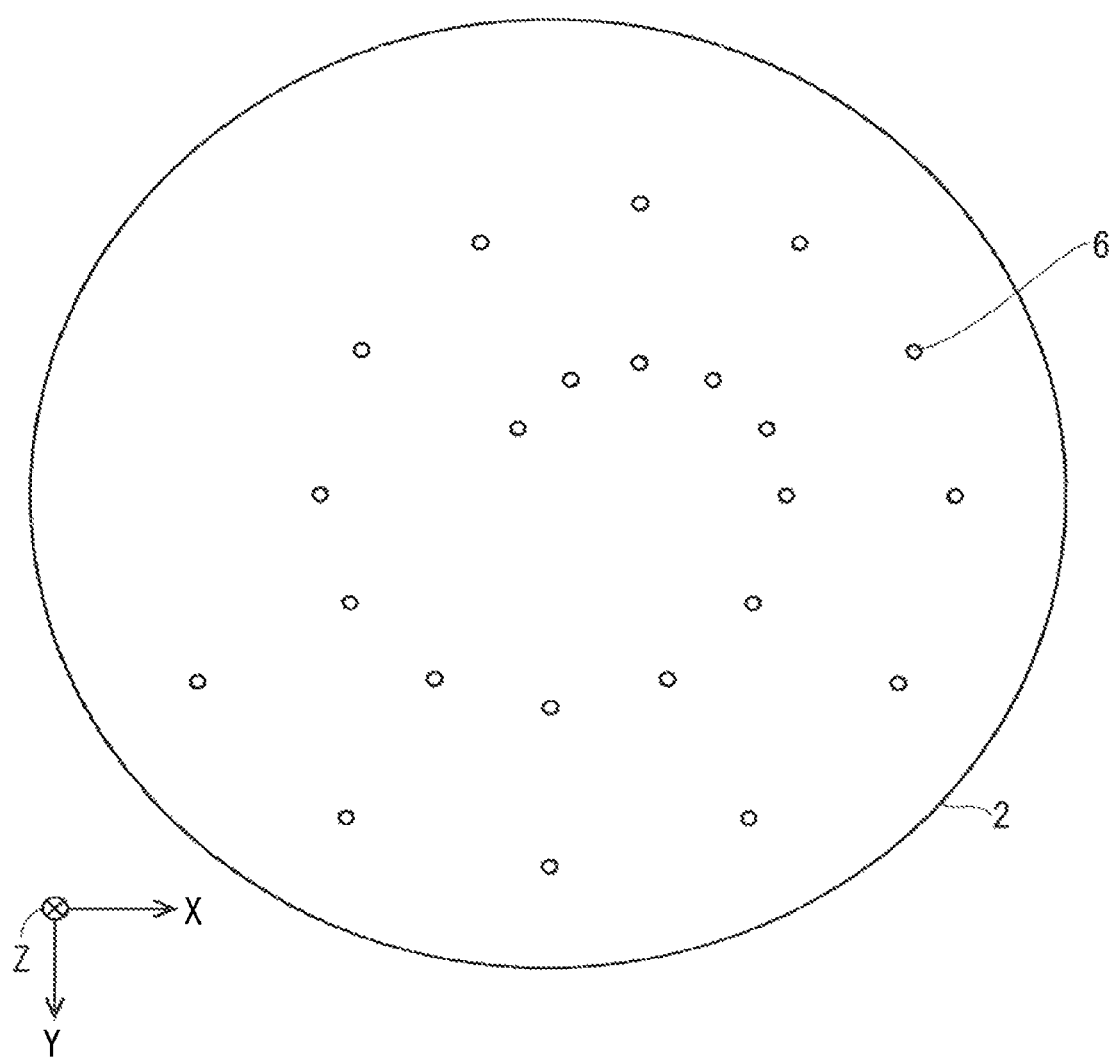
FIG. 8 is a bottom plan view illustrating the planar structure of the electrode unit base.

FIG. 8 is a bottom plan view illustrating the planar structure of the electrode unit base 2.

As illustrated in FIGS. 2 and 6 to 8, the plurality of gas jets 6 are discretely and selectively provided to penetrate a region of the electrode unit base 2 under the bottom of the gas passing groove 24 as the internal gas flow path. The plurality of gas jets 6 are provided below the discharge space to lead to the bottom of the gas passing groove 24. That is to say, the plurality of gas jets 6 communicate with the gas passing groove 24. The active gas generated in the gas passing groove 24 can thus be externally jetted from the plurality of gas jets 6.

The electrode unit lid 1 and the electrode unit base 2 are each configured by the dielectric, such as alumina.

As illustrated in FIGS. 2, 3, 6, and 7, a high-voltage conduction point P1 of the high-voltage electrode 11 is provided at the center of the front surface of the electrode unit base 2. The high-voltage electrode groove 21 is set to have a formation depth shallower than the depth D2 in a near high-voltage conduction point region R21 near the high-voltage conduction point P1 as a first conduction point.

As illustrated in FIGS. 2, 4, and 6, a ground conduction point P2 is provided at a leading end of a bent portion of the ground electrode 12 in the vicinity of the periphery of the front surface of the electrode unit base 2. The ground electrode groove 22 is set to have a formation depth shallower than the depth D2 in a near ground conduction point region R22 near the ground conduction point P2 as a second conduction point.

The high-voltage electrode groove 21 and the ground electrode groove 22 are set to have the formation depths shallower than the depth D2 respectively in the near high-voltage conduction point region R21 and the near ground conduction point region R22 because the discharge space is not formed in the near high-voltage conduction point region R21 and in the near ground conduction point region R22.

As illustrated in FIGS. 2 and 6, the ground conduction point P2 is provided to be spaced from the end of the high-voltage electrode groove 21 by an insulation distance L2. Insulation between the ground conduction point P2 as the second conduction point and the high-voltage electrode 11 can thus surely be maintained.

(Electrode Unit Lid 1)

Figure 9:
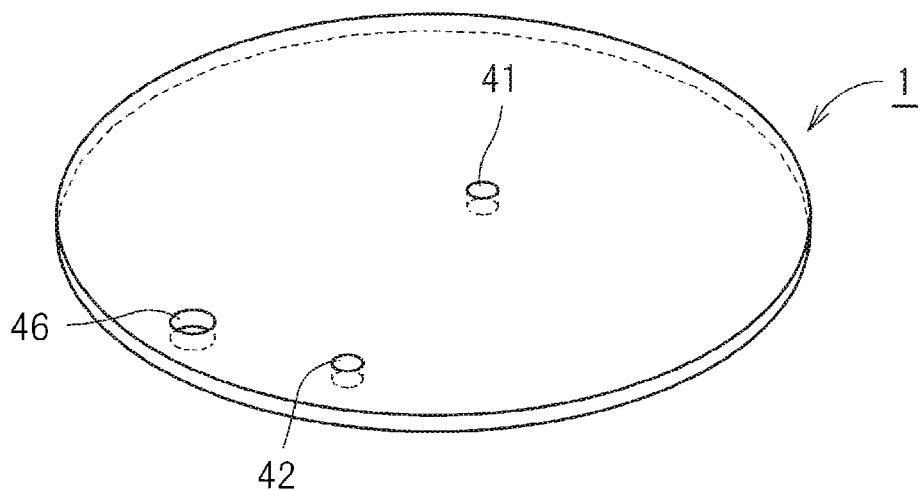
FIG. 9 is a perspective view illustrating the structure of an electrode unit lid.

FIG. 9 is a perspective view illustrating the structure of the electrode unit lid 1. As illustrated in FIG. 9, the electrode unit lid 1 is circular in plan view to match the shape of the front surface of the electrode unit base 2, and has a high-voltage conduction hole 41, a ground conduction hole 42, and a gas relay hole 46.

The high-voltage conduction hole 41 as a first through hole is provided to penetrate a central region of the electrode unit lid 1, and the ground conduction hole 42 as a second through hole and the gas relay hole 46 are each provided to penetrate the electrode unit lid 1 in the vicinity of the periphery of the electrode unit lid 1.

The high-voltage conduction hole 41 is a hole for electrical connection to the high-voltage conduction point P1, the ground conduction hole 42 is a hole for electrical connection to the ground conduction point P2, and the gas relay hole 46 is a hole for supply of the source gas to the gas passing groove 24 of the electrode unit base 2.

The electrode unit lid 1 is set so that the gas passing groove 24 is located below the gas relay hole 46 when the electrode unit lid 1 is placed on the front surface of the electrode unit base 2.

As for the high-voltage conduction hole 41, the ground conduction hole 42, and the gas relay hole 46, there is no need to provide a gas sealing member, such as an O-ring, between the electrode unit base 2 and the electrode unit lid 1, and thus the size of the electrode unit 100 (the electrode unit lid 1+the electrode unit base 2) can be reduced.

(Electrode Cooling Plate 3)

Figure 10:
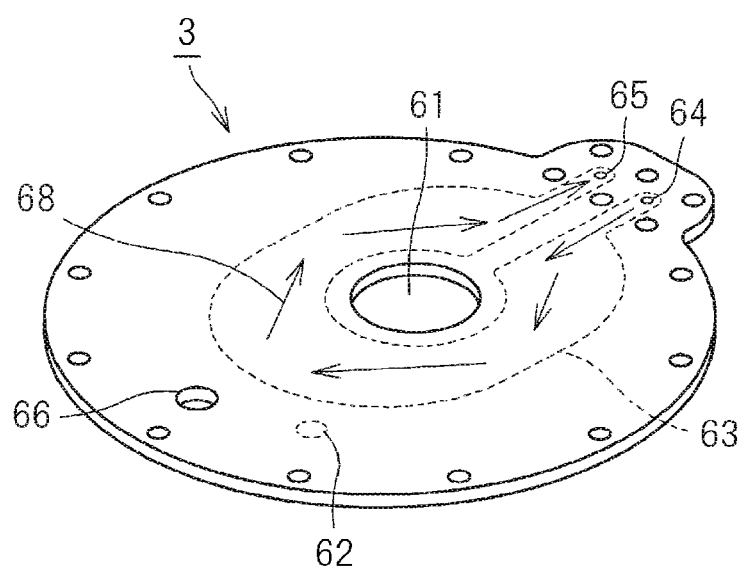
FIG. 10 is a perspective view illustrating the structure of an electrode cooling plate.

FIG. 10 is a perspective view illustrating the structure of the electrode cooling plate 3. As illustrated in FIG. 10, the electrode cooling plate 3 has a substantially circular shape partially having a protruding region in plan view to match the shapes of the front surfaces of the electrode unit base 2 and the coolant manifold 37. A portion of the electrode cooling plate 3 in a circular region other than the protruding region is placed on the electrode unit base 2.

The electrode cooling plate 3 further has a high-voltage opening 61, a ground conduction groove 62, a coolant supply groove 63, a coolant input hole 64, a coolant output hole 65, and a gas supply hole 66.

The high-voltage opening 61 (an opening) is provided to penetrate a central region of the electrode unit base 2 The high-voltage opening 61 includes the high-voltage conduction hole 41 of the electrode unit lid 1 as a whole in plan view and has a wider shape than the high-voltage conduction hole 41 when the electrode cooling plate 3 is placed on the electrode unit lid 1.

The ground conduction groove 62 is a groove provided from a side of a rear surface of the electrode cooling plate 3 so as not to penetrate the electrode cooling plate 3 for electrical connection to the ground conduction point P2 through the ground conduction hole 42.

The coolant supply groove 63 is a hollow region internally provided to the electrode cooling plate 3 without being exposed to a front surface and the rear surface. A coolant acquired from the coolant input hole 64 flows in the coolant supply groove 63 along a coolant flow 68. The coolant having flowed in the coolant supply groove 63 is eventually output from the coolant output hole 65.

The coolant input hole 64 and the coolant output hole 65 are provided in the protruding region of the electrode cooling plate 3. The electrode cooling plate 3 is placed so that the protruding region is located on the front surface of the coolant manifold 37.

The electrode cooling plate 3 can be formed by bonding two plates each having a portion corresponding to the coolant supply groove in one side thereof so that surfaces in which the portions corresponding to the coolant supply groove are formed oppose each other. Examples of the bonding include thermal diffusion joining and welding. The coolant supply groove 63 as illustrated in FIG. 10 can be formed in the electrode cooling plate 3 by bonding the two plates as described above.

(Generator Base Flange 8 and Coolant Manifold 37)

Figure 11:
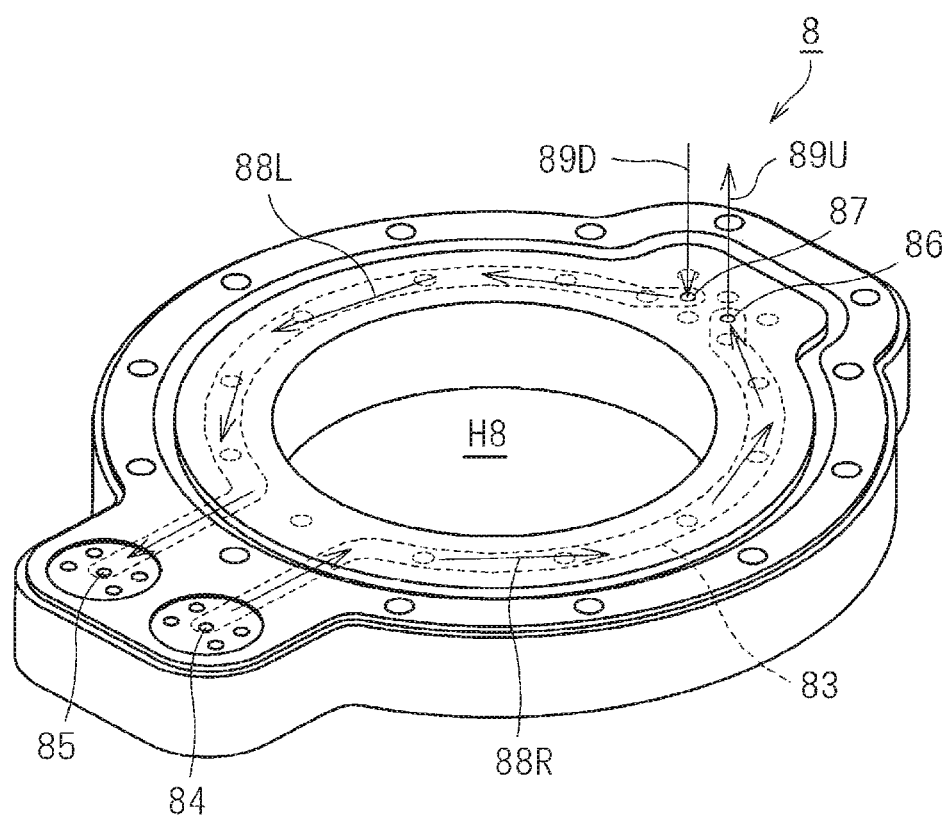
FIG. 11 is a perspective view illustrating the structure of a generator base flange.

FIG. 11 is a perspective view illustrating the structure of the generator base flange 8. As illustrated in FIG. 11, the generator base flange 8 is formed to have a substantially annular shape having the circular opening H8 at the center and first and second protruding regions at opposite ends in plan view.

A coolant supply groove 83 is internally provided to the generator base flange 8 along the periphery of the opening H8. The coolant supply groove 83 can be formed using processing technology of friction stir welding (FSW) or welding.

The coolant supply groove 83 is a groove allowing a coolant to flow in the generator base flange 8. A coolant supplied through a coolant input hole 84 provided in the second protruding region flows on one circumferential side of the coolant supply groove 83 along a coolant flow 88R.

The coolant is then output from a coolant input hole 86 provided in the first protruding region to the coolant manifold 37 above the generator base flange 8 along an upward coolant flow 89U.

A coolant acquired from the coolant manifold 37 flows to a coolant output hole 87 provided in the first protruding region along a downward coolant flow 89D.

The coolant then flows on the other circumferential side of the coolant supply groove 83 along a coolant flow 88L. The coolant is discharged from a coolant output hole 85 provided in the second protruding region.

Figure 12:
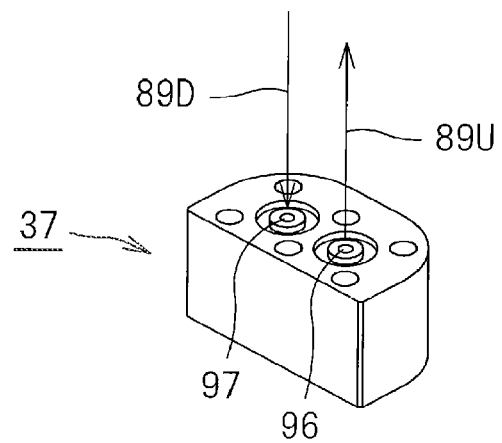
FIG. 12 is a perspective view illustrating the structure of a coolant manifold.
Figure 13:
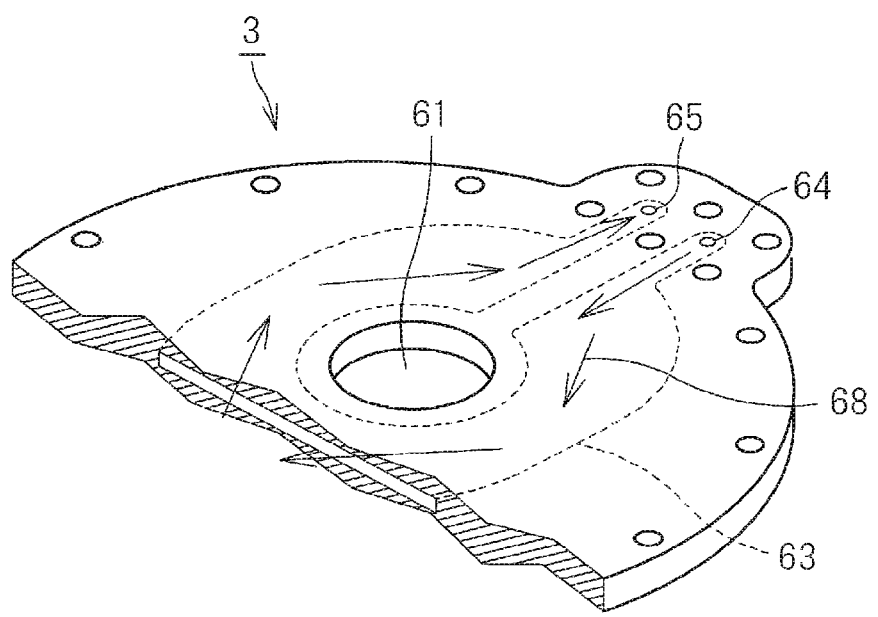
FIG. 13 is an enlarged illustration of a coolant flow in the electrode cooling plate.

FIG. 12 is a perspective view illustrating the structure of the coolant manifold 37. FIG. 13 is an enlarged illustration of the coolant flow 68 in the electrode cooling plate 3.

As illustrated in FIG. 12, the coolant manifold 37 has a shape matching the shape of the first protruding region (a region in which the coolant input hole 86 and the coolant output hole 87 are formed) of the generator base flange 8 in plan view. The coolant manifold 37 has a coolant input hole 96 and a coolant output hole 97 as through holes.

The coolant supplied through the coolant input hole 86 of the generator base flange 8 below the coolant manifold 37 along the upward coolant flow 89U in each of FIGS. 11 to 13 is output through the coolant input hole 96 of the coolant manifold 37 to the electrode cooling plate 3 above the coolant manifold 37. The coolant supplied through the coolant input hole 64 of the electrode cooling plate 3 flows in the coolant supply groove 63 along the coolant flow 68.

The coolant having passed the coolant supply groove 63 is output through the coolant output hole 97 of the coolant manifold 37 and the coolant output hole 87 of the generator base flange 8 along the downward coolant flow 89D to the coolant supply groove 83 of the generator base flange 8.

(Assembly)

Figure 14:
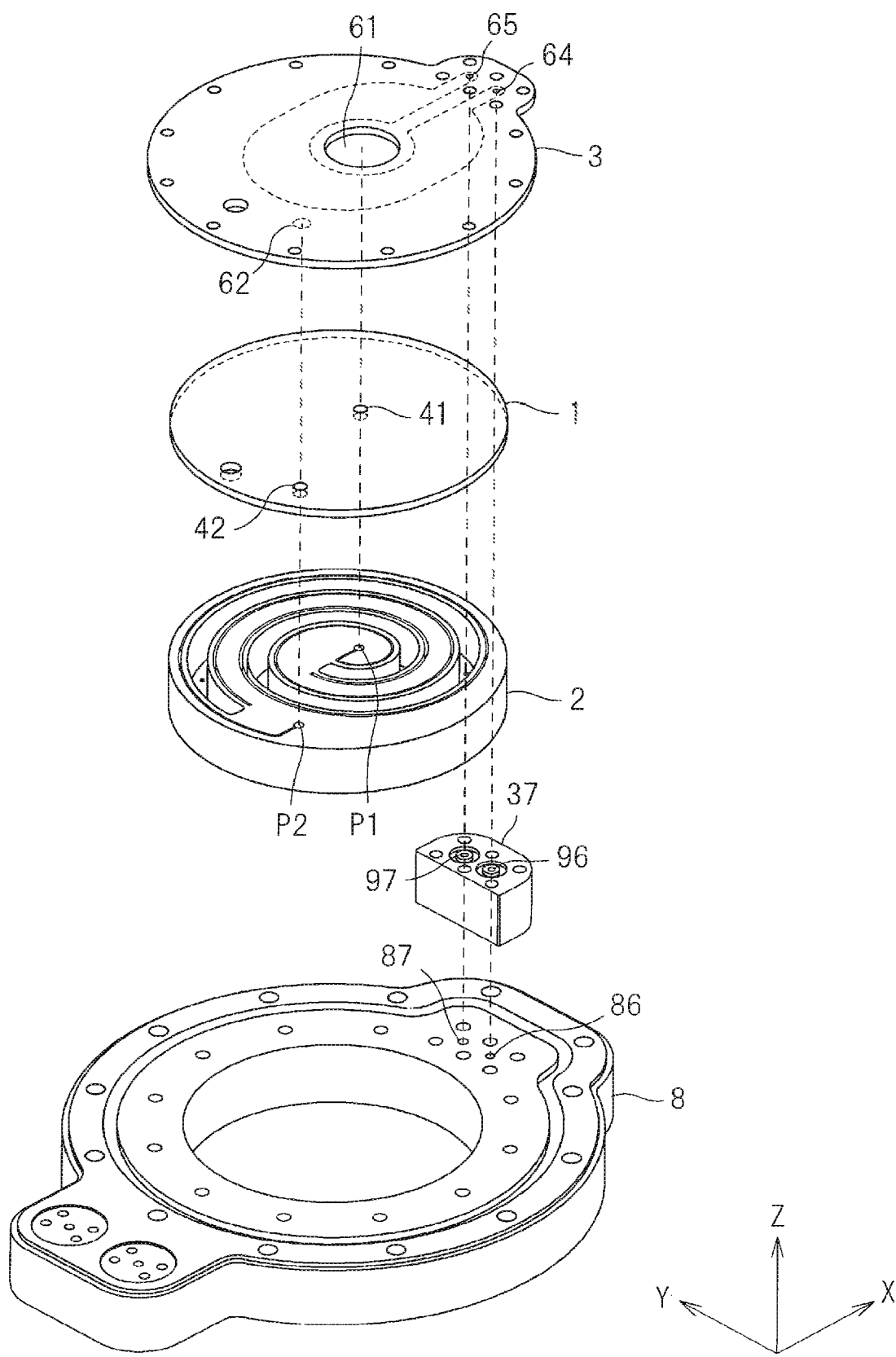
FIG. 14 is an illustration schematically showing the assembly of the electrode cooling plate, the electrode unit lid, the electrode unit base, the coolant manifold, and the generator base flange.
Figure 15:
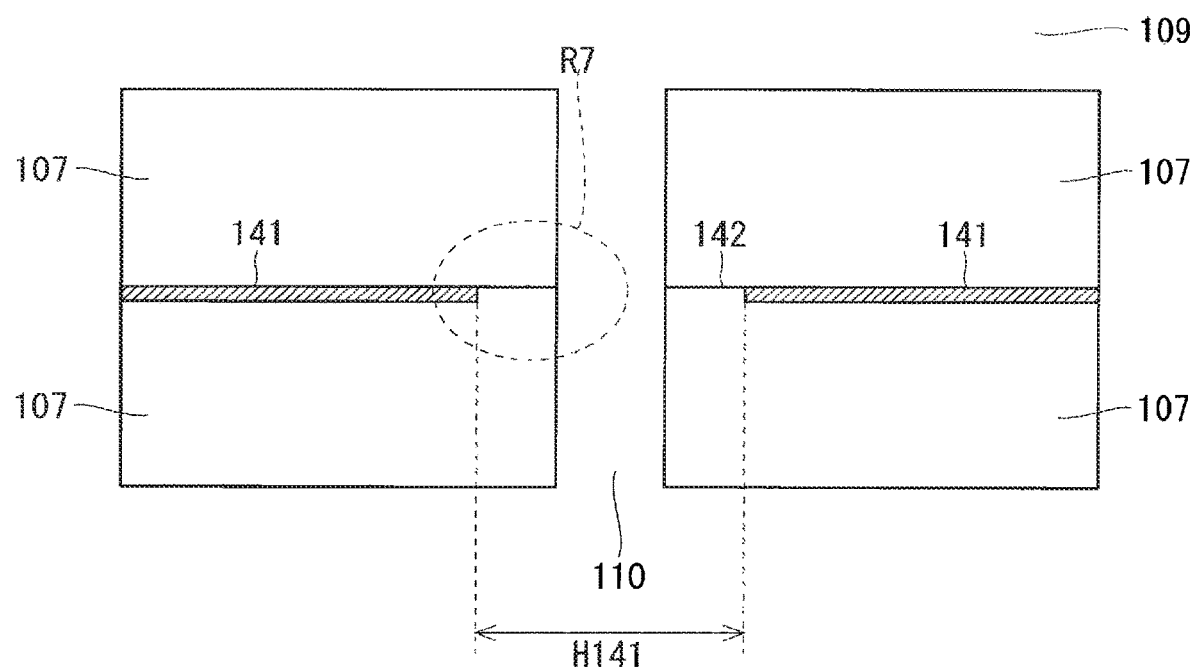
FIG. 15 is a sectional view illustrating a sectional structure of a second basic configuration in second conventional technology.
Figure 16:
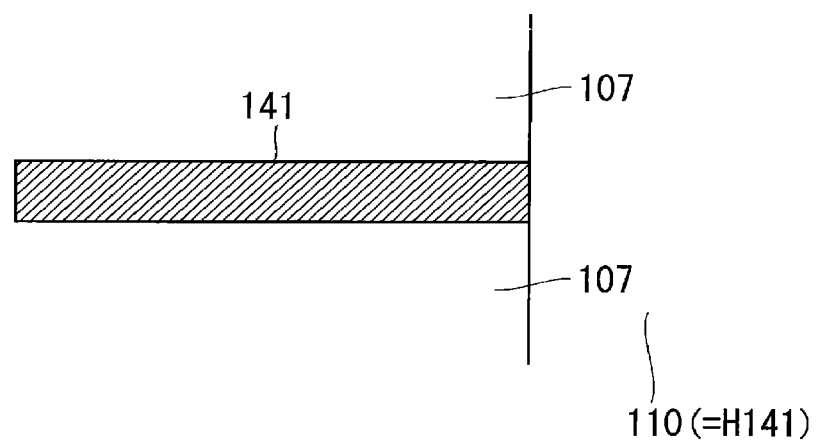
FIG. 16 is a sectional view illustrating a sectional structure of a modification of the second basic configuration in the second conventional technology.

FIG. 14 is an illustration schematically showing the assembly of the electrode cooling plate 3, the electrode unit lid 1, the electrode unit base 2, the coolant manifold 37, and the generator base flange 8. The XYZ Cartesian coordinate system is shown in FIG. 14.

As illustrated in FIG. 14, the coolant manifold 37 and the protruding region of the electrode cooling plate 3 are placed on the first protruding region of the generator base flange 8 so that the coolant input hole 64 of the electrode cooling plate 3, the coolant input hole 96 of the coolant manifold 37, and the coolant input hole 86 of the generator base flange 8 coincide with one another in plan view.

Furthermore, the coolant manifold 37 and the protruding region of the electrode cooling plate 3 are placed on the first protruding region of the generator base flange 8 so that the coolant output hole 65 of the electrode cooling plate 3, the coolant output hole 97 of the coolant manifold 37, and the coolant output hole 87 of the generator base flange 8 coincide with one another in plan view.

In addition, the electrode unit lid 1 is placed on the front surface of the electrode unit base 2 so that the high-voltage conduction hole 41 of the electrode unit lid 1 and the high-voltage conduction point P1 of the electrode unit base 2 coincide with each other in plan view. Furthermore, the electrode cooling plate 3 is placed on the front surface of the electrode unit lid 1 so that the high-voltage opening 61 (opening) includes the high-voltage conduction hole 41 as a whole in plan view.

Furthermore, the electrode unit lid 1 is placed on the front surface of the electrode unit base 2, and the electrode cooling plate 3 is placed on the front surface of the electrode unit lid 1 so that the ground conduction groove 62 of the electrode cooling plate 3, the ground conduction hole 42 of the electrode unit lid 1, and the ground conduction point P2 of the electrode unit base 2 coincide with one another in plan view.

(Supply of Source Gas)

A source gas supply system in the active gas generation apparatus 10 in the present embodiment having the above-mentioned structure will be described.

A source gas is externally supplied, through the gas supply flanges 39 and the source gas supply paths 33 provided in one side surface of the apparatus housing 30, into the containing space SP30 in the apparatus housing 30.

The source gas in the containing space SP30 is supplied, through the gas supply hole 66 of the electrode cooling plate 3 and the gas relay hole 46 of the electrode unit lid 1, to the gas passing groove 24 of the electrode unit base 2.

The source gas having flowed from the gas supply hole 66 and the gas relay hole 46 thus passes in the gas passing groove 24.

(Electrical Connection to High-Voltage Electrode 11 and Ground Electrode 12)

The high-voltage conduction point P1 at the center of the electrode unit base 2 is an electrically connected portion of the high-voltage electrode 11 embedded in the high-voltage electrode groove 21 of the electrode unit base 2.

In the active gas generation apparatus 10, the high-voltage conduction point P1 as the first conduction point of the electrode unit base 2 can be connected to the high-voltage terminal 71 through the high-voltage conduction hole 41 of the electrode unit lid 1 and the high-voltage opening 61 of the electrode cooling plate 3.

As illustrated in FIG. 1, the high-voltage terminal 71 provided to the top portion of the apparatus housing 30 and the high-voltage electrode 11 can thus electrically be connected to each other relatively easily by electrically connecting an electrically connected portion P71 of the high-voltage terminal 71 and the high-voltage conduction point P1 of the high-voltage electrode 11 through the high-voltage opening 61 of the electrode cooling plate 3 and the high-voltage conduction hole 41 of the electrode unit lid 1.

In this case, an opening region of the high-voltage opening 61 (opening) is sufficiently larger than the high-voltage conduction hole 41, and thus the electrically connected portion P71 does not come into contact with the electrode cooling plate 3 when the electrically connected portion P71 and the high-voltage conduction point P1 are electrically connected to each other.

On the other hand, the ground conduction point P2 in the vicinity of the periphery of the electrode unit base 2 is an electrically connected portion of the ground electrode 12 embedded in the ground electrode groove 22 of the electrode unit base 2.

The electrode cooling plate 3 and the ground electrode 12 can thus electrically be connected to each other relatively easily by electrically connecting the ground conduction point P2 of the electrode unit base 2 and the ground conduction groove 62 of the electrode cooling plate 3 through the ground conduction hole 42 of the electrode unit lid 1.

That is to say, the ground conduction point P2 can electrically be connected to the electrode cooling plate 3 relatively easily by connecting the ground conduction groove 62 and the ground conduction point P2 through the ground conduction hole 42 using a ground conductive member, which is not illustrated.

By setting the electrode cooling plate 3 having conductivity to ground level, the ground electrode 12 can simultaneously be set to the ground level.

The pressing force is applied from above to the electrode cooling plate 3 as the electrode pressing plate by the elastic member, such as the spring, which is not illustrated. The electrode cooling plate 3 can thus maintain good electrical connection between the ground conduction point P2 and the ground conduction groove 62 using the ground conductive member by the pressing force applied from above.

Furthermore, the electrode cooling plate 3 can stably press the electrode unit lid 1 with the pressing force applied from above.

(Cooling Function of Electrode Cooling Plate 3)

A cooling function of the electrode cooling plate 3 will be described below with reference to FIGS. 1 and 10 to 14.

As illustrated in FIG. 1, a coolant supply flange 35 is provided to a top portion of the generator base flange 8. The coolant supply flange 35 is attached onto the front surface of the generator base flange 8 by attachment screws 47.

A coolant as the cooling medium can thus externally be supplied through the coolant supply flange 35 into the generator base flange 8.

As illustrated in FIGS. 1 and 11, the coolant is supplied, into the coolant supply groove 83, from the coolant input hole 84 provided at a location coinciding with a supply path of the coolant supply flange 35 in plan view. The coolant flows on one circumferential side of the coolant supply groove 83 along the coolant flow 88R, and is output from the coolant input hole 86 to the coolant manifold 37 above the generator base flange 8 along the coolant flow 89U.

As illustrated in FIGS. 1 and 12, the coolant flows through the coolant input hole 96 of the coolant manifold 37 to the electrode cooling plate 3 above the coolant manifold 37 along the upward coolant flow 89U.

As illustrated in FIGS. 1, 10, and 13, the coolant acquired from the coolant input hole 64 flows in the coolant supply groove 63 having an annular shape along the coolant flow 68, and is eventually discharged from the coolant output hole 65. The electrode cooling plate 3 can fulfill the cooling function by the coolant flowing in the coolant supply groove 63.

The coolant having flowed in the coolant supply groove 63 is discharged through the coolant output hole 65 to the coolant manifold 37 below the electrode cooling plate 3.

As illustrated in FIGS. 1 and 12, the coolant then flows through the coolant output hole 97 of the coolant manifold 37 to the generator base flange 8 below the coolant manifold 37 along the downward coolant flow 89D.

As illustrated in FIGS. 1 and 11, the coolant is supplied through the coolant output hole 87 to the coolant supply groove 83 along the downward coolant flow 89D in the generator base flange 8. The coolant then flows on the other circumferential side of the coolant supply groove 83 along the coolant flow 88L. The coolant is externally discharged through a coolant discharge flange, which is not illustrated, having a discharge path in a region coinciding with the coolant output hole 85 in plan view. The coolant discharge flange is provided on the front surface of the generator base flange 8 as with the coolant supply flange 35.

A coolant is then externally supplied through the coolant supply flange 35 into the generator base flange 8 again. As described above, the coolant is allowed to flow in the generator base flange 8, the coolant manifold 37, and the electrode cooling plate 3 to circulate the coolant in the coolant supply groove 63 of the electrode cooling plate 3 and to circulate the coolant in the coolant supply groove 83 of the generator base flange 8.

As described above, by circulating the coolant in the coolant supply groove 63 of the electrode cooling plate 3, the electrode cooling plate 3 can fulfill the cooling function to cool the electrode unit base 2 through the electrode unit lid 1.

Furthermore, by circulating the coolant in the coolant supply groove 83 of the generator base flange 8, the generator base flange 8 can fulfill the cooling function to cool the electrode unit base 2.

(Effects)

The electrode unit base 2 in the active gas generation apparatus 10 in the present embodiment includes the gas passing groove 24 as the internal gas flow path provided to be helical in plan view and the plurality of gas jets 6 (at least one gas jet) provided below the discharge space to communicate with the gas passing groove 24.

The active gas generation apparatus 10 in the present embodiment thus has an effect of effectively suppressing a phenomenon of deactivation of the active gas because a non-discharge space uninvolved in a dielectric barrier discharge is not formed between the plurality of gas jets 6 and the discharge space.

Furthermore, the above-mentioned effect can be produced by a relatively easy configuration in which the plurality of gas jets 6, the high-voltage electrode 11, the ground electrode 12, and the gas passing groove 24 are provided to the electrode unit base 2, the high-voltage conduction hole 41, the ground conduction hole 42, and the gas relay hole 46 are provided to the electrode unit lid 1, and the high-voltage opening 61, the ground conduction groove 62, the gas supply hole 66, and the like are provided to the electrode cooling plate 3. An apparatus configuration of the active gas generation apparatus 10 can thereby be simplified.

In addition, in the active gas generation apparatus 10, the gas passing groove 24 is provided to be helical in plan view. The active gas can thus be jetted from the plurality of gas jets 6 with a gas concentration being saturated without increasing the area of the electrode unit base 2 itself, so that the size of the apparatus can be reduced.

Furthermore, the electrode unit lid 1 in the active gas generation apparatus 10 has the high-voltage conduction hole 41 and the ground conduction hole 42 as through holes provided respectively in a region coinciding with the high-voltage conduction point P1 and a region coinciding with the ground conduction point P2 in plan view.

The electrode unit lid 1 can thus block a top portion of the electrode unit base 2 while securing a function to externally and electrically connect the high-voltage conduction point P1 and the ground conduction point P2 respectively through the high-voltage conduction hole 41 and the ground conduction hole 42.

Furthermore, the electrode cooling plate 3 as the electrode pressing plate has the high-voltage opening 61 including the high-voltage conduction hole 41 of the electrode unit lid 1 in plan view, and having a wider shape than the high-voltage conduction hole 41 when the electrode cooling plate 3 is placed on the electrode unit lid 1.

The electrode cooling plate 3 can thus secure the function to electrically connect the high-voltage conduction point P1 and the external high-voltage terminal 71 through the high-voltage conduction hole 41, and can electrically be connected to the ground conduction point P2 through the ground conduction hole 42.

Furthermore, the electrode cooling plate 3 pressing the electrode unit lid 1 with the pressing force applied from above can stably press the electrode unit lid 1.

In addition, in the active gas generation apparatus 10 in the present embodiment, the high-voltage electrode 11 and the ground electrode 12 are arranged in the electrode unit 100 so that the ground electrode 12 is located on the outermost periphery of the electrode unit base 2 in plan view.

A electric field vector from the high-voltage electrode 11, to which a high voltage is applied, to the periphery of the electrode unit base 2 can always be absorbed by the ground electrode 12 located closer to the periphery than the high-voltage electrode 11.

Furthermore, the active gas generation apparatus 10 can cool the electrode unit base 2 through the electrode unit lid 1 using the above-mentioned cooling function of the electrode cooling plate 3 to remove heat in the electrode unit base 2.

In addition, in the active gas generation apparatus 10 in the present embodiment, the electrode cooling plate 3, the electrode unit lid 1, the electrode unit base 2, and the cooling medium circulation mechanism (the coolant manifold 37+the generator base flange 8) are integrally joined together by the attachment screws 48, so that the size of the active gas generation apparatus 10 can be reduced.

While the present invention has been described in detail above, the foregoing description is in all aspects illustrative and does not restrict the present invention. It is understood that numerous modifications not having been described can be devised without departing from the scope of the present invention.

The invention claimed is:

1. An active gas generation apparatus generating an active gas by activating a source gas supplied to a discharge space in which a dielectric barrier discharge occurs, the active gas generation apparatus comprising:
    an electrode unit base including a first electrode and a second electrode, and externally receiving an AC voltage;

an electrode unit lid located on a front surface of said electrode unit base;

an electrode pressing plate located on a front surface of said electrode unit lid, said electrode pressing plate pressing said electrode unit lid with a pressing force applied from above said electrode pressing plate; and an apparatus housing containing said electrode unit base, said electrode unit lid, and said electrode pressing plate, wherein said electrode unit base includes:

a first electrode groove and a second electrode groove each having a predetermined formation depth from the front surface of said electrode unit base;

said first electrode and said second electrode embedded respectively in said first electrode groove and said second electrode groove, said first electrode and said second electrode each having conductivity; and an internal gas flow path located in said electrode unit base, and allowing the source gas to pass therethrough, said internal gas flow path being disposed to be helical in plan view, said first electrode and said second electrode each being disposed to be helical in plan view along with said internal gas flow path, said first electrode and said second electrode respectively have a first conduction point and a second conduction point at ends thereof, said first electrode and said second electrode are arranged on opposite sides of said internal gas flow path to oppose each other with a part of said electrode unit base and said internal gas flow path therebetween, a region in said internal gas flow path between said first electrode and said second electrode being said discharge space, the dielectric barrier discharge occurring in said discharge space upon reception of said AC voltage, said electrode unit base further includes at least one gas jet located below said discharge space to communicate with said internal gas flow path, the active gas acquired by activating the source gas supplied to said discharge space being jetted from said at least one gas jet, said electrode unit lid has a gas relay hole leading to said internal gas flow path in said electrode unit base, and a first through hole and a second through hole located respectively in a region coinciding with said first conduction point and a region coinciding with said second conduction point in plan view, and said electrode pressing plate has an opening including said first through hole in plan view and having a wider shape than said first through hole, and a gas supply hole located in a region coinciding with said gas relay hole in plan view, and said electrode pressing plate is electrically connected to said second conduction point through said second through hole.

2. The active gas generation apparatus according to claim 1, wherein said second electrode is set to ground level, and said AC voltage is applied to said first electrode, and said first electrode and said second electrode are arranged so that said second electrode is located on an outermost periphery of said electrode unit base in plan view.

3. The active gas generation apparatus according to claim 2, further comprising a cooling medium circulation mechanism supporting said electrode unit base from a side of a rear surface, and circulating a cooling medium in said electrode pressing plate, wherein said electrode pressing plate has a cooling function to cool said electrode unit base from a side of said electrode unit lid.

4. The active gas generation apparatus according to claim 3, wherein said electrode unit base, said electrode unit lid, said electrode pressing plate, and said cooling medium circulation mechanism are integrally joined together.

5. The active gas generation apparatus according to claim 2, further comprising an AC voltage supply terminal attached to a top portion of said apparatus housing and supplying said AC voltage, wherein said AC voltage supply terminal is electrically connected to said first conduction point through said opening and said first through hole.

\* \* \* \* \*